(12) United States Patent
Kim

(10) Patent No.: US 10,892,727 B2
(45) Date of Patent: Jan. 12, 2021

(54) ADAPTIVE EQUALIZATION APPARATUS AND METHOD OF USING THE SAME

(71) Applicant: QUALITAS SEMICONDUCTOR CO., LTD., Seoul (KR)

(72) Inventor: Duho Kim, Seoul (KR)

(73) Assignee: QUALITAS SEMICONDUCTOR CO., LTD., Seoul (KR)

( * ) Notice: Subject to any disclaimer, the term of this patent is extended or adjusted under 35 U.S.C. 154(b) by 0 days.

(21) Appl. No.: 16/529,039

(22) Filed: Aug. 1, 2019

(65) Prior Publication Data

US 2020/0274510 A1    Aug. 27, 2020

(30) Foreign Application Priority Data

Feb. 22, 2019   (KR) .................. 10-2019-0020930
Feb. 22, 2019   (KR) .................. 10-2019-0020935

(51) Int. Cl.
*H03G 5/16*      (2006.01)
*H04L 25/03*   (2006.01)

(52) U.S. Cl.
CPC ....... *H03G 5/165* (2013.01); *H04L 25/03108* (2013.01); *H04L 25/03267* (2013.01); *H04L 25/03949* (2013.01); *H04L 25/03885* (2013.01)

(58) Field of Classification Search
CPC ............. H04L 25/03885; H04L 25/063; H04L 25/03057; H04L 2025/03356; H04L 7/0058; G11B 5/035
USPC ....................................................... 375/229
See application file for complete search history.

(56) References Cited

U.S. PATENT DOCUMENTS

| 2002/0064108 A1* | 5/2002 | Miyashita ......... G11B 20/10111 |
| | | 369/47.35 |
| 2011/0299585 A1* | 12/2011 | Tomita .............. H04L 25/03057 |
| | | 375/236 |
| 2013/0162309 A1* | 6/2013 | Tamura ..................... H03L 7/06 |
| | | 327/156 |

FOREIGN PATENT DOCUMENTS

KR          10-1074454 B1    10/2011

* cited by examiner

*Primary Examiner* — Leila Malek
(74) *Attorney, Agent, or Firm* — Novick, Kim & Lee, PLLC; Sang Ho Lee

(57) ABSTRACT

Provided are an adaptive equalization apparatus and a method using the same of, for optimizing digital algorithm, responding proactively in dynamic environmental change, and adjusting the monitoring range according to the signal size. The adaptive equalization apparatus includes a first equalizer filter for compensating and outputting for components of a high frequency band of an input signal; a second equalizer filter for, installed in parallel with the first equalizer filter, monitoring the input signal; a size comparison unit for sampling the size of a monitoring signal from the second equalizer filter at each period of an asynchronous clock signal; and a digital control unit for collecting the comparison data in the size comparison unit as changing an equalizer monitoring code to be provided to the second equalizer filter and a reference signal of the size comparison unit, and finding and providing an optimal equalizer control code to the first equalizer filter based on the collected comparison data; wherein the second equalizer filter compensates and outputs the input signal according to an equalizer monitoring code of the digital control unit to find an optimal equalizer control code in the digital control unit.

18 Claims, 11 Drawing Sheets

Case of sampling only the center of data with the synchronized clock

Case of sampling with the low-speed asynchronous clock

ADAPTIVE EQUALIZATION APPARATUS AND METHOD OF USING THE SAME

TECHNICAL FIELD

The present invention is an adaptive equalization apparatus and a method using the same of, and more particularly to an adaptive equalization apparatus and a method using the same of, which can detect distorted levels to output the optimum signal.

BACKGROUND ART

An equalizer compensates for attenuation or distortion of signals used in transmission process using a certain channel.

Generally, the equalizer technology used in a high-speed adaptive equivalent is designed with various structures such as a decision feedback equalizer and a tap-delay line filter.

Meanwhile, to effectively compensate for the change in channel characteristics according to any process or temperature change, the high-speed adaptive equalizer uses various compensation methods. For example, a conventional high-speed adaptive equalizer adjusts the high-frequency voltage gain of an equalizer filter to minimize the power difference after comparing the powers of the high frequency components of both equalizer filter's output signal and reference signal.

Accordingly, the adaptive equalization device (Korean Patent Registration No. 10-1074454) is disclosed to reduce power consumption as it does not require a high-speed clock generator.

The adaptive equalization device (Korean Patent Registration No. 10-1074454) extracts a histogram from the received signals, calculates Q-factor, and then evaluates transmission quality of the received signal. Since the size of the maximum value on the histogram is the largest in an optimal equalization state, the Q-factor is considered as the best and applied to the equalizer as the optimum state with the current state. That is, the voltage level at random points can be read by sampling with an asynchronous clock.

In addition, the adaptive equalization device (Korean Patent Registration No. 10-1074454) performs the sampling the input signal randomly and records the numbers of smaller level to comparison voltage for input signal. As the recorded results is appeared in the form of a cumulative density function CDF.

But the conventional adaptive equalization device (Korean Patent Registration No. 10-1074454) have a problem that the digital circuit area is increased by using large numbers of registers, since the all data for the cumulative density function CDF is kept until the end of adaptation.

In addition, the conventional adaptive equalization device (Korean Patent Registration No. 10-1074454) have a problem that distorts the signal while monitoring the signal. In other words, the changed control code of the equalizer is reflected directly in the output signal, since the conventional adaptive equalization devices must monitor for the control codes to find the optimal signal, thereby limitedly applying to the corresponding technical fields. Accordingly, the conventional adaptive equalization device can not follow for dynamic changes in the environment, because the control codes is fixed with a calibration state in the initial state.

In addition, the conventional adaptive equalization device (Korean Patent Registration No. 10-1074454) has a problem that the signal size effects to the accuracy. This means that if the input signal is too small, the minimum resolution size of the resolution should be smaller since the histogram's discrimination capacity is reduced. While if the input signal is too large, the maximum range of observations should be larger, since the histogram is not properly observed. In order to meet the above two conditions, it should observe the signal in wide ranges while observing the signal in detail, there are disadvantages of taking a long time to perform adaptation completion and increasing the size of the monitoring circuit.

SUMMARY OF THE INVENTION

Technical Problem

A purpose of the present invention is to provide an adaptive equalization apparatus and a method using the same of, which optimize a digital algorithm, responds proactively in dynamic environmental change, and adjust the monitoring range according to the signal size.

Technical Solution

According to an aspect of the present invention, there is provided an adaptive equalization apparatus comprises a first equalizer filter for compensating and outputting for components of a high frequency band of an input signal; a second equalizer filter for, installed in parallel with the first equalizer filter, monitoring the input signal; a size comparison unit for sampling the size of a monitoring signal from the second equalizer filter at each period of an asynchronous clock signal; and a digital control unit for collecting the comparison data in the size comparison unit as changing an equalizer monitoring code to be provided to the second equalizer filter and a reference signal of the size comparison unit, and finding and providing an optimal equalizer control code to the first equalizer filter based on the collected comparison data; wherein the second equalizer filter compensates and outputs the input signal according to an equalizer monitoring code of the digital control unit to find an optimal equalizer control code in the digital control unit.

The size comparison unit comprise a reference signal generation unit for generating a reference signal of an analog component corresponding to a reference signal control code from the digital control unit; an analog comparison unit for obtaining a difference between the monitoring signal from the second equalizer filter and the reference signal from the reference signal generation unit and outputting the difference as an analog signal; and a sampling circuit unit for sampling and digitizing the output signal outputted from the analog comparison unit for each period of the input asynchronous clock signal.

The reference signal control code is a code for determining the level of the reference signal and is any one selected among N codes having different levels.

The digital control unit adjusts the size of the input signal so that the input signal received by the size comparison unit has a range of a specific reference signal; calculates the peak value of a histogram by changing the equalizer monitoring code of the second equalizer filter or the reference signal of the size comparison unit after the adjustment is completed; and applies an optimal equalizer control code found on the basis of the calculated peak value to the first equalizer filter.

According to the other aspect of the present invention, there is provided an adaptive equalization method in an adaptive equalization apparatus including a first equalizer filter for compensating and outputting for components of a high frequency band of a input signal; a second equalizer filter for, installed in parallel with the first equalizer filter, monitoring the input signal; a size comparison unit for sampling the size of the monitoring signal from the second equalizer filter at each period of the asynchronous clock signal; and a digital control unit for collecting the comparison data in the size comparison unit as changing an equalizer monitoring code and a reference signal of the size comparison unit which will be provided to the second equalizer filter, and finding and providing an optimal equalizer control code to the first equalizer filter based on the collected comparison data, the method comprises adjusting the size of the input signal so that the input signal received by the size comparison unit has a range of a specific reference signal; and calculating the peak value of the histogram by changing the equalizer monitoring code of the second equalizer filter or a reference signal of the size comparison unit, and applying an optimal equalizer control code found on the basis of the calculated peak value to the first equalizer filter.

The adaptive equalization method further comprises moving a standby mode when the input signal for the adaptive equalization apparatus is too small, and moving the standby mode when the applying step is completed.

The adjusting step comprises setting an amplification gain of the second equalizer filter to a minimum value; collecting N-times sampling results in the size comparison unit after setting the reference signal to a − middle reference signal; collecting N-times sampling results in the size comparison unit after setting the reference signal to a + middle reference signal if the sampling results are all High signal; determining whether the current amplification gain is the maximum if the N-times sampling results in the size comparison unit are all Low signal after setting the reference signal to the + middle reference signal; and returning to the step of collecting N-times sampling results in the size comparison unit, after increasing the current amplification gain if the current amplification gain is not the maximum and setting the reference signal to the middle of the reference signal.

If the N-times sampling results in the size comparison unit are not all High signal after setting the reference signal to the − middle reference signal, or if all of the N-times sampling results in the size comparison unit are not Low signal after setting the reference signal to the + middle reference signal, then a present process moves to the applying step to performs the operation of the corresponding step.

If the current amplification gain is the maximum, the present process enters the standby mode.

The adjusting step comprises setting a range of the reference signal in the size comparison unit to a maximum level; collecting N-times sampling results in the size comparison unit after setting the reference signal to the − middle reference signal; collecting N-times sampling results in the size comparison unit after setting the reference signal to the + middle reference signal if the sampling results are all High signal; determining whether a range of the current reference signal is a minimum value if all the N-times sampling results in the size comparison unit are Low signal after setting the reference signal to the + middle reference signal; and returning to the step of collecting the N-times sampling results in the size comparison unit, after reducing the range of the current reference signal if the range of the current reference signal is not the minimum and setting the reference signal to the − middle reference signal.

If the N-times sampling results in the size comparison unit are not all High signal after setting the reference signal to the − middle reference signal, or if all of the N-times sampling results in the size comparison unit are not Low signal after setting the reference signal to the + middle reference signal, then the current process moves to the applying step to perform the operation of the corresponding step.

If the range of the current reference signal is the minimum value, the present process enters to the standby mode.

The applying step comprises setting an equalizer monitoring code K as 0, a reference signal control code S as 0, a maximum peak as 0, and an optimal code as 0; inputting a K-th equalizer monitoring code to the second equalizer filter; generating a reference signal corresponding to an S-th reference signal control code, collecting X-times sampling results in the size comparison unit, and counting High signal of sampling results; determining whether an absolute value of a difference between the counted current count value and a previous counted value is greater than the maximum peak; replacing the maximum peak with the absolute value of the difference between the current counting value and the previous counting value, if the absolute value of the difference between the current counting value and the previous counting value is greater than the maximum peak, replacing the maximum peak with a value of the present monitoring code, and replacing the previous counting value with the current counting value; determining whether a value of the reference signal control code is a maximum value of a predetermined reference signal control code; determining whether the value of the equalizer monitoring code is the maximum value of a predetermined equalizer monitoring code if the value of the reference signal control code is the maximum value of the reference signal control code; and wherein if the value of the equalizer monitoring code is the maximum value of a predetermined equalizer monitoring code, the optimum code is used as an optimal equalizer control code is reflected on the first equalizer filter.

If the absolute value of the difference between the current counting value and the previous counting value is not greater than the maximum peak, and the previous counting value is replaced with the current counting value without replacement of the maximum peak and the optimum code.

As a result of the determination in the step of determining whether the value of the reference signal control code is the maximum value of the preset reference signal control code, if the value of the reference signal control code is not the maximum value of the reference signal control code; the method further comprising generating the reference signal corresponding to the S-th reference signal control code is generated by adding +1 the value of the reference signal control code, collecting the X-times sampling result in the size comparison unit and moving to the step of counting the High signal of sampling results to be collected.

As a result of the determination in the step of determining whether the value of the equalizer monitoring code is the maximum value of the equalizer monitoring code, if the value of the equalizer monitoring code is not the maximum value of a predetermined equalizer monitoring code; the present process moves the step of inputting the K-th equalizer monitoring code to the second equalizer filter by adding +1 the value of the equalizer monitoring code.

In the standby mode the power of the first equalizer filter is turned off, if it is determined that there is no signal in the adjusting step.

In the standby mode, the power of the second equalizer filter and the size comparison unit is turned off, after the applying step.

Advantageous Effects

According to this configuration of the present invention, it may reduce the area of a digital control unit by optimizing an algorithm of the digital control unit.

It will also be responded proactively against dynamic changes in the environment by adding an equalizer filter dedicated to signal monitoring, to change the algorithm to allow the digital control units to adapt continuously to the equalizer.

In addition, the monitoring ranges can be adjusted according to the signal size, and signal detector function can be performed by adding input signal size determination function to the digital control unit.

DETAILED DESCRIPTION OF THE INVENTION

Figure 1:
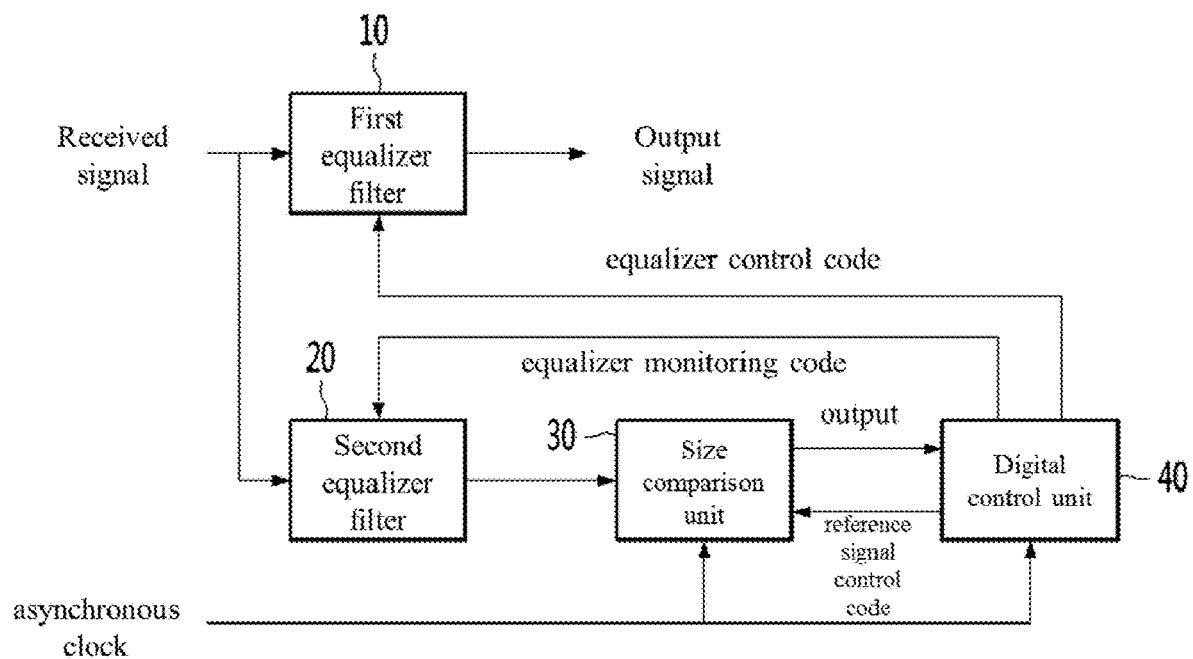
FIG. 1 is a block diagram of an adaptive equalization apparatus according to a preferred embodiment of the present invention.

This invention is intended to illustrate and detail specific examples of implementation on the drawings, as it may cause various changes and have multiple practices.

However, this is not intended to limit this invention to a particular type of implementation and should be understood to include all modifications, equivalents or substitutes within the thought and technical scope of this invention.

The terms used in this application were used only to describe a particular exercise and are not intended to limit this invention. The expression of a singular number includes multiple expressions, unless explicitly meaning otherwise in the context. In this application, the terms "comprise" or "have" shall be understood to specify the existence of features, numbers, steps, actions, components, parts, or combinations listed in the specification and not preclude the existence or addition of one or more other features, numbers, steps, operations, components, parts, or combinations thereof.

Unless otherwise defined, all terms used herein, including technical or scientific terms, have the same meaning as generally understood by those with common knowledge in the technical field to which this invention belongs. Terms such as those defined in the dictionary commonly used should be interpreted as having meaning consistent with meaning in the context of the relevant technology and, unless explicitly defined in this application, are not interpreted in an ideal or overly formal sense.

The following, referring to the drawings attached, is a more detailed description of the desired examples of this invention. To facilitate the overall understanding of this invention, the same reference is used for the same component on the drawing and the duplicate description is omitted for the same component.

FIG. 1 is a block diagram of an adaptive equalization apparatus according to a preferred embodiment of the present invention.

The adaptive equalization apparatus according to the present invention is includes a first equalizer filter 10, a second equalizer filter 20, a size comparison unit 30, and a digital control unit 40.

The first equalizer filter 10 can compensate and output for the component of the high frequency band of the actually received signal. The first equalizer filter 10 receives equalizer control codes from the digital control unit 40. The first equalizer filter 10 may select an equalization coefficient in response to the equalizer control code, and perform equalization process with the equalization gain corresponding to the selected equalization coefficient.

The second equalizer filter 20 is installed in parallel with a signal reception end of with the first equalizer filter 10.

The second equalizer filter 20 may have the same operational characteristics as the first equalizer filter 10, since the second equalizer filter 20 has a function of compensating and output for the high frequency band component of the received signal as the first equalizer filter 10.

On the other hand, the second equalizer filter 20 may be an equalization filter dedicated to perform signal monitoring. The second equalizer filter 20 may find an optimal equalizer control code capable of optimally compensating the input signal according to the equalizer monitoring code of the digital control unit 40.

That is, the second equalizer filter 20 can compensate and output the input signal according to the equalizer monitoring code of the digital control unit 40 to find the optimal equalizer control code. The signal output from the second equalizer filter 20 may be referred to as a monitoring signal.

The first equalizer filter 10 and the second equalizer filter 20 include an input signal end, an output signal end, a low frequency the gain control end, and a high frequency the gain control end. Here, the low frequency gain control end receives a signal for controlling the amount by which the low frequency band of the signal is amplified and the high frequency gain control end receives a signal for controlling the amount by which the high frequency band of the signal is amplified. The low frequency gain control can control the magnitude of the input signal and can control the amplification gain. The high-frequency gain control can control the transition speed of the input signal and can change the waveform itself.

The equalizer control code of the digital control unit 40 is input to the low frequency gain control end or the high frequency gain control end of the first equalizer filter 10 depending on the situation. The equalizer monitoring code of the digital control unit 40 is input to the low frequency gain control end or the high frequency gain control end of the second equalizer filter 20 depending on the situation. That is, a predetermined equalizer monitoring code may be input to the low-frequency gain control end for the amplification gain of the input signal of the second equalizer filter 20. When a waveform of the input signal of the second equalizer filter 20 is to be changed to control the transition speed of the signal, a predetermined equalizer monitoring code is input to the high-frequency gain control.

The size comparison unit 30 receives a predetermined clock signal (e.g., an asynchronous clock), receives the monitoring signal from the second equalizer filter 20, and receives the reference signal control code from the digital control unit 40.

Accordingly, the size comparison unit 30 measures (or performs) the sampling the size of the input signal (monitoring signal) from the second equalizer filter 20 every cycle of the inputted clock signal (asynchronous clock). In other words, the size comparison unit 30 performs the sampling the input signal at every cycle of the clock signal (asynchronous clock) and compares the input signal with the digitally controlled reference voltage to digitize and output the High or Low signal. The more detailed description of the size comparison unit 30 will be described later.

The digital control unit 40 provides the equalizer control code to the first equalizer filter 10 and provides the equalizer monitoring code (also referred to as a high frequency band gain control code) to the second equalizer filter 20, and to provide the reference signal control code to the size comparison unit 30.

The digital control unit 40 collects the comparison data in the size comparison unit 30 while changing the equalizer monitoring code to be provided to the second equalizer filter 20 and the reference signal of the size comparison unit 30, and sequentially searches for an optimal equalizer control code based on the collected comparison data. The found optimal equalizer control code is applied to the first equalizer filter 10.

That is, the digital control unit 40 counts the number of High signal of the comparison data while changing the equalizer monitoring code (for example, a high frequency band gain code input to the high frequency gain control end) to be provided to the second equalizer filter 20 and the reference signal to be provided to the size comparison unit 30. Then, the digital control unit 40 calculates the difference between the current counting value and the previous counting value to optimally determine the largest peak on the probability density function PDF, and provides the corresponding equalizer control code to the first equalizer filter 10.

In other words, the digital control unit 40 adjusts the magnitude of the input signal received from the corresponding adaptive equalizer, and observes the characteristics of the second equalizer filter 20 based on the magnitude of the input signal, then a code for the optimal high frequency band gain (i.e., the equalizer control code) may be applied to the first equalizer filter 10.

Figure 2:
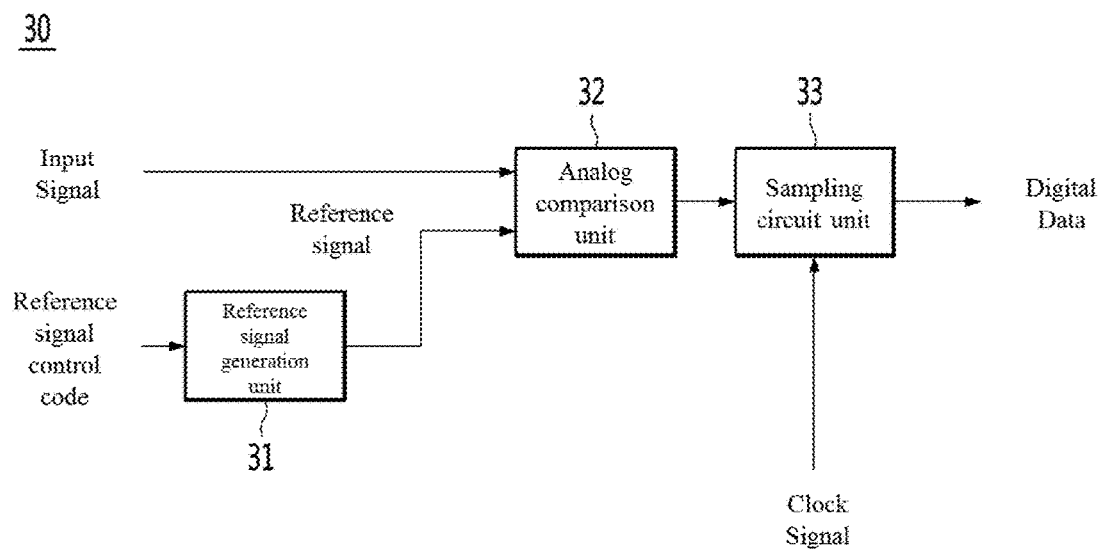
FIG. 2 is an internal configuration diagram of a size comparison unit shown in FIG. 1.

FIG. 2 is an internal configuration diagram of a size comparison unit shown in FIG. 1, FIGS. 3, 4 and 5A and 5B are views to explain a size comparison unit in FIG. 1.

The size comparison unit 30 may include a reference signal generation unit 31, an analog comparison unit 32, and a sampling circuit unit 33 as shown in FIG. 2.

The reference signal generation unit 31 generates a reference signal of an analog component (also referred to as a reference voltage) corresponding to the reference signal control code output from the digital control unit 40. Here, the reference signal control code is a code for determining the level of the reference voltage, and, for example, may be any one of 16 or codes having different levels each other.

Therefore, the reference signal control codes applied to the reference signal generation unit 31 can be any one of 16 codes having different levels. The reference signal output from the reference signal generation unit 31 varies according to the reference signal control code.

The analog comparison unit 32 obtains the difference between the input signal (i.e., the monitoring signal from the second equalizer filter 20) and the reference signal from the reference signal generation 31, and outputs the difference as an analog signal.

The sampling circuit unit 33 performs the sampling and digitizes the output from the analog comparison unit 32 at every cycle of the input clock signal (for example, the asynchronous clock). Therefore, the sampling circuit unit 33 outputs predetermined digital data (e.g., High or Low signal).

Here, the clock signal is a signal that provides a point of time when the comparison is to be performed, and can generally use a rising edge or a falling edge of a corresponding signal.

Referring to FIG. 2, the analog comparison unit 32 and the sampling circuit unit 33 are separately configured, but they can be integrated if necessary.

Figure 3:
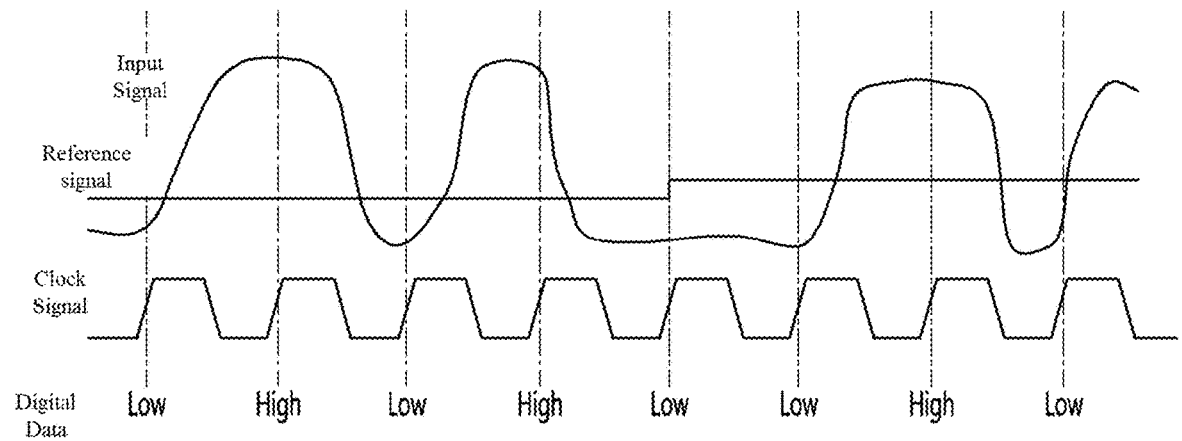
FIGS. 3, 4 and 5A and 5B are views to explain a size comparison unit in FIG. 1.

The size comparison unit 30 configured as described above compares the magnitude of the input signal with the internally generated reference signal as shown in FIG. 3. The size comparison unit 30 performs the sampling at every period of the clock signal, determines the magnitude, and outputs digital data corresponding thereto. The reference signal to be compared depends on the control.

Figure 4:
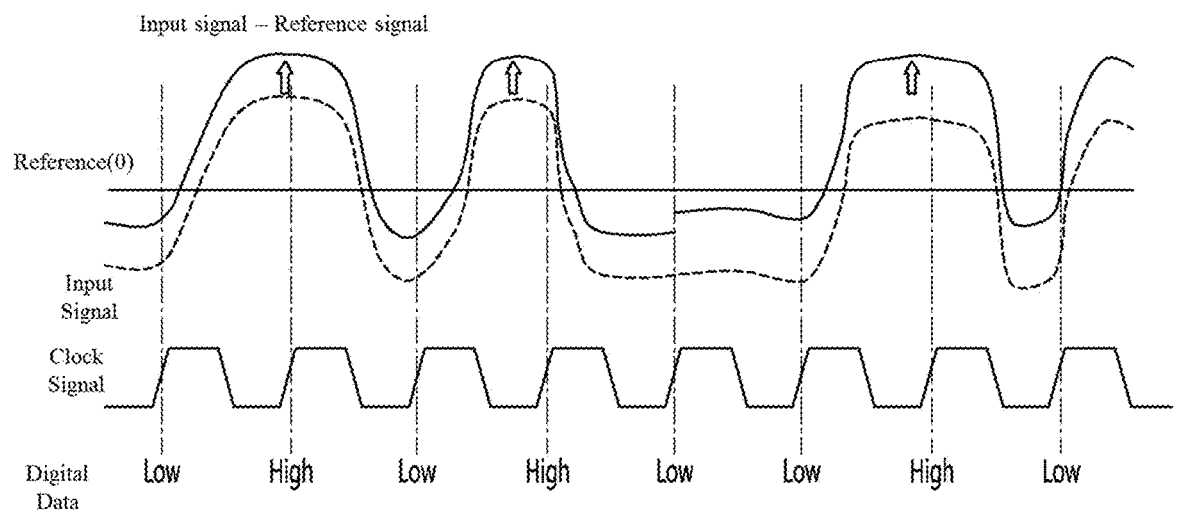

Meanwhile, the size comparison unit 30 makes a signal by using the difference by subtracting the reference signal from the input signal as shown in FIG. 4, and it may be implemented by a method of comparing the signal with a reference of zero (0).

Figure 5A:
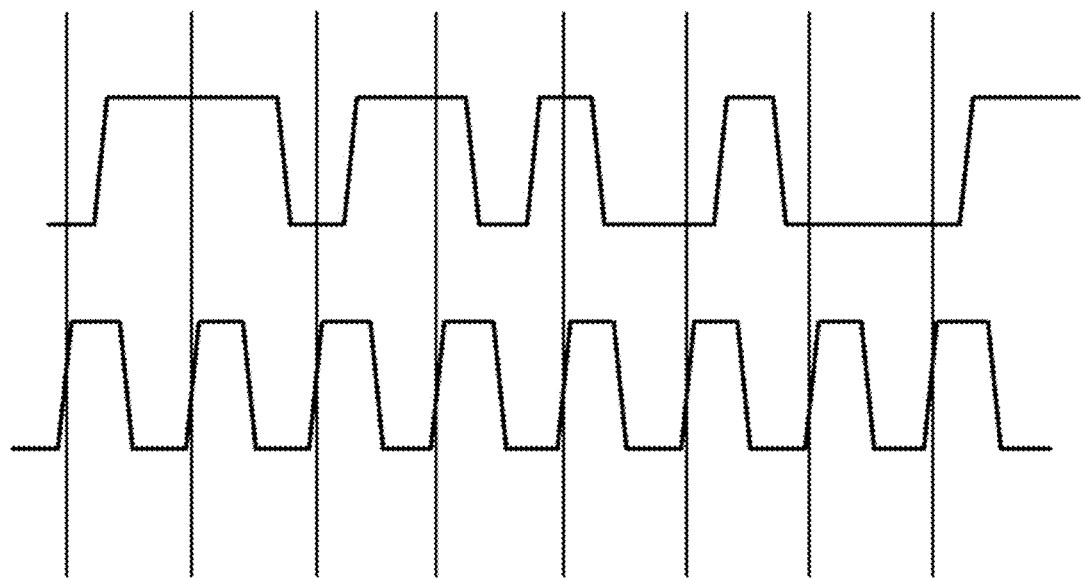
Figure 5B:
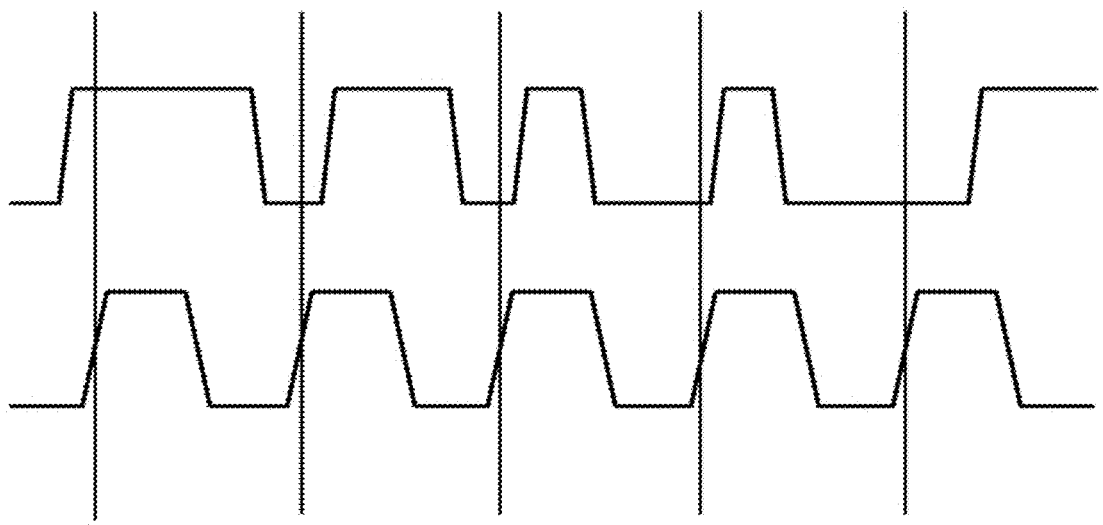

Unlike the case of sampling only the center of data with the synchronized clock of FIG. 5A, the size comparison unit 30 randomly performs the sampling the input signal when receiving the asynchronous clock as shown in FIG. 5B. In this case, the probability that the input signal is High/Low signal is 50:50. Since the sampling is not performed at a specific time point of each input signal bit, a sampling value at a random time point can be obtained. There is no data at the sampling time but data on the distribution of the sampled voltages (i.e., allowing the counting of the number of High and Low signal of the comparison data) can be obtained.

If the asynchronous clock is inputted, a random sampling is performed, so a low-speed clock can be used. That is, as compared with the case of sampling only the center of the data with the synchronized clock as shown in FIG. 5A, the use of the low-speed asynchronous clock as shown in FIG. 5B can reduce the power consumption and the circuit size, since the burden of the operation speed may be reduced.

Figure 6:
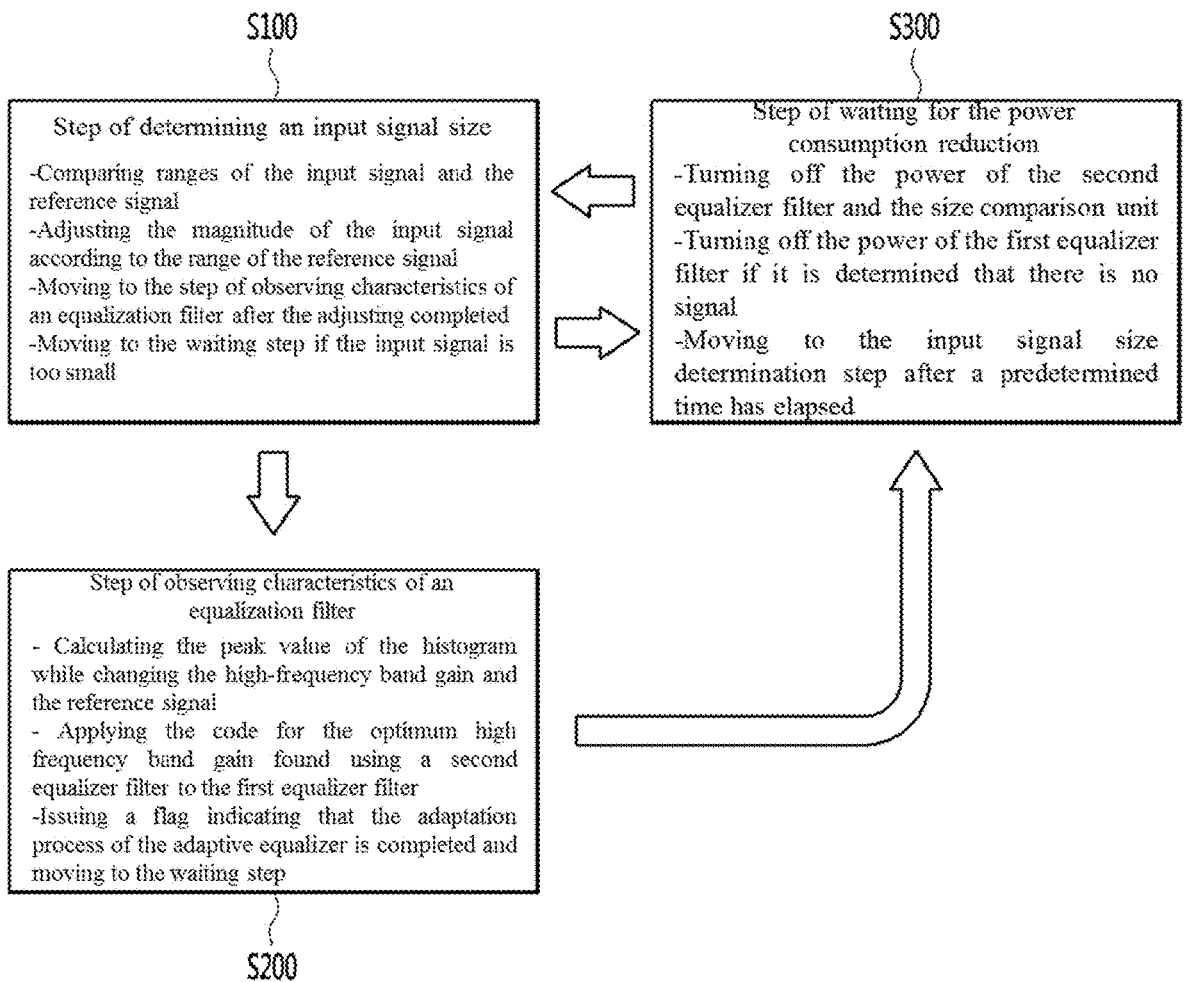
FIG. 6 is a view for explaining an adaptive equalization method according to a preferred embodiment of the present invention.

FIG. 6 is a view for explaining an adaptive equalization method according to the preferred embodiment of the present invention.

The adaptive equalization method according to the preferred embodiment of the present invention includes the steps of determining an input signal size S100, observing characteristics of an equalization filter S200, and waiting for the power consumption reduction S300, and has a circulation structure. The adaptive equalization method according to a preferred embodiment of the present invention is performed in the adaptive equalization apparatus described with reference to FIGS. 1 to 5.

In the input signal size determination step S100, it is performed the step of adjusting the magnitude of the input signal so that the input signal is approximately ½ of the range of the reference signal after comparing a range of the input signal input from the adaptive equalization apparatus (i.e., the monitoring signal) input from the size comparison unit 30. When the size adjustment of the input signal is completed, the process moves to step S200 of observing the equalization filter characteristic. If the input signal is too small, the process moves to step S300. Here, the input signal size determination step S100 may be regarded to as an input signal size adjustment step.

The reason why the size of the input signal is adjusted so that the input signal is approximately ½ of the range of the reference signal (i.e., between the maximum value and the minimum value of the reference signal) in the input signal size determination step S100 is that of decreasing if the input signal is too large or small. The accuracy in the step S200 of observing the equalization filter characteristics is degraded. That is, if the input signal is approximately ½ of the range of the reference signal, the characteristics of the second equalizer filter 30 to be monitored can be better observed, and the optimal equalizer control code may be provided to the first equalizer filter 10.

In step S200 of observing characteristics of an equalization filter, the peak value of the histogram is calculated while changing the high-frequency band gain or the reference signal of the second equalizer filter 20 and applied the code (i.e., the equalizer control code) to the first equalizer filter 10 for the optimum high frequency band gain found using a second equalizer filter 20. Thereafter, a flag indicating that the adaptation process of the adaptive equalizer is completed is issued, and the process moves to the waiting step S300. Here, the step S200 of observing the equalization filter characteristics may be regarded to as an equalizer control code application step.

In the waiting step of S300 (i.e., a standby mode), the power of the second equalizer filter 20 and the size comparison unit are turned off for reducing the power consumption after the equalization filter characteristic observation step S200. If it is determined that there is no signal in the input signal size determination step S100, the power of the first equalizer filter 10 is also turned off, after a predetermined time has elapsed, the process moves to step S100 of determining the input signal size.

The input signal size determination step S100, the equalization filter characteristic observation step S200, and the standby step S300 described above can be sufficiently performed under the control of the digital control unit 40.

FIGS. 7 to 13 are views for explaining a size determination step of an input signal shown in FIG. 6.

If the input signal inputted to the adaptive equalization apparatus according to the preferred embodiment of the present invention is too large or too small, the accuracy in the observation step S200 of the equalization filter characteristic is decreased. Accordingly, in the input signal size determination step S100, it is preferable to adjust the range of the input signal or the reference signal so that the magnitude of the input signal is approximately ½ the range of the reference signal. If the input signal is too small, it may be determined that there is no signal and enter to the standby mode (i.e., waiting step S300).

Figure 7:
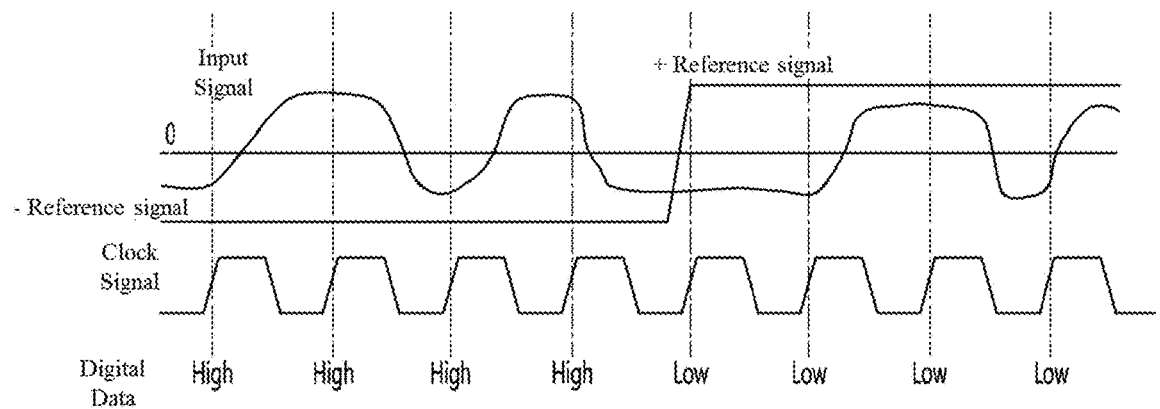
FIGS. 7 to 13 are views for explaining a size determination step of an input signal shown in FIG. 6.
Figure 8:
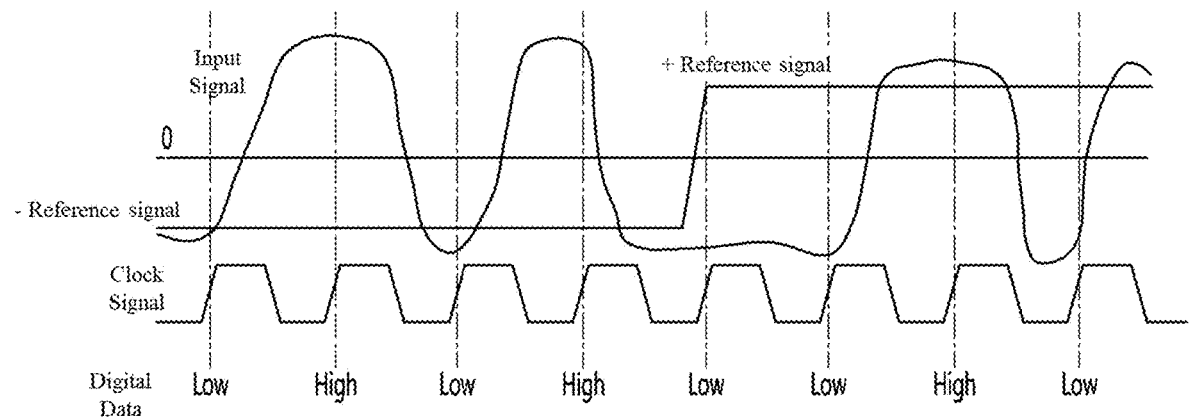

In the input signal size determination step S100, a +/- reference signal of the same size is used with reference to 0 as shown in FIG. 7. When the input signal is compared with the -reference signal as shown in FIG. 7. All the comparison values of the size comparison unit 30 are High signal and when the comparison value of the size comparison unit 30 is Low signal, the input signal is compared with the + reference signal. The digital control unit 40 can determine that the range of the input signal is smaller than the range of the reference signal. On the other hand, as shown in FIG. 8. If an opposite value of the comparison value in the size comparison unit 30 starts to be mixed, the digital control unit 40 can determine that the range of the input signal is larger than the range of the reference signal.

In order to determine the size of the input signal in comparison with the input signal and the reference signal, a method of increasing the amplification gain of the second equalizer filter 20 or a method of reducing the range of the reference signal may be employed.

Figure 9:
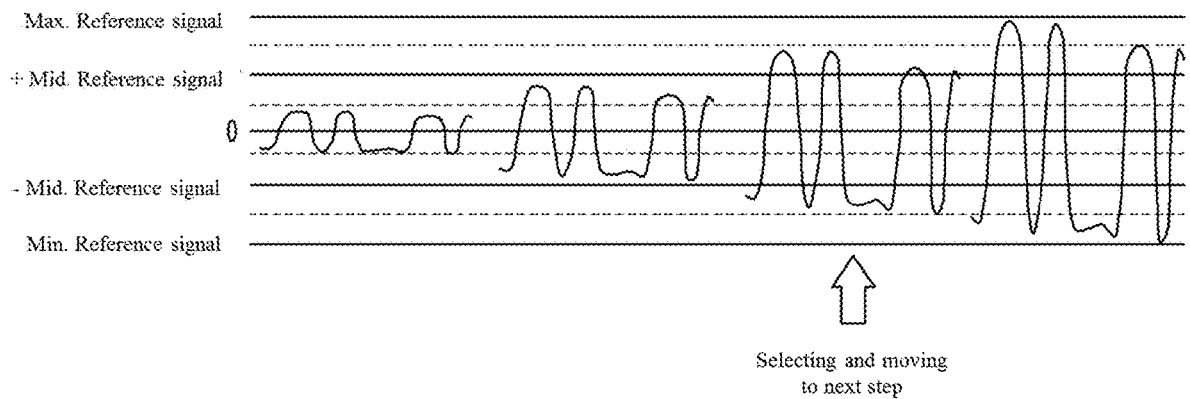

First, a method of finding a amplification gain that is larger than the reference signal while gradually increasing the amplification gain of the second equalizer filter 20 will be described with reference to FIG. 9. In FIG. 9, it may find the first gain that is larger than the reference signal while gradually increasing the amplification gain of the second equalizer filter 20. That is, when the amplification gain of the second equalizer filter 20 is increased by one step, the first code that becomes larger than the middle of the +/- reference signal (that is, the equalizer monitoring code input to the low frequency gain control end). If the first code that becomes larger than the middle of the +/- reference signal is found, it is selected and the next step (that is, step S200 of observing the equalization filter characteristic) is performed. If the amplification gain is made too large, the characteristics of the second equalizer filter 20 is not be observed. On the other hand, even if the amplification gain is increased, it is judged that there is no signal if the input signal is not larger than the middle of the reference signal.

Figure 10:
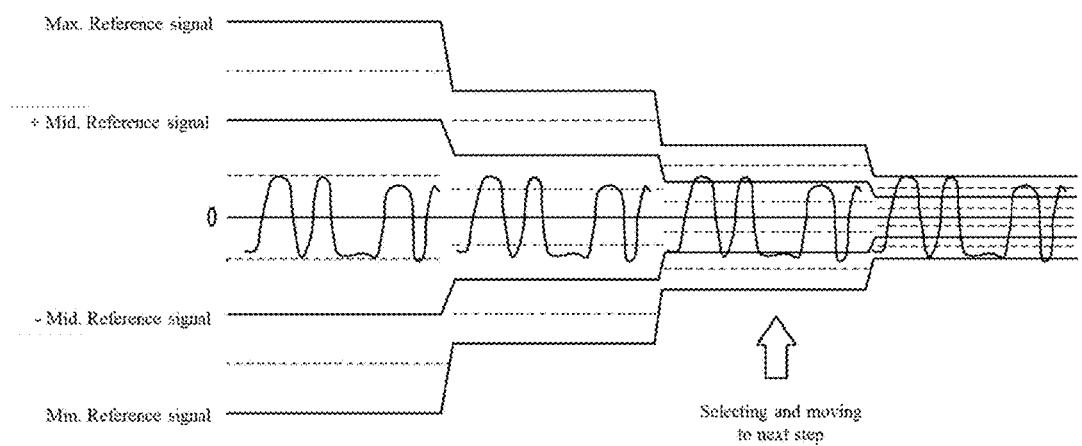

Now, a method of reducing the range of the reference signal without increasing the amplification gain of the second equalizer filter 20 will be described with reference to FIG. 10. In FIG. 10, it may search a code having a larger input signal (that is, the reference signal control code) than the middle of the range of the reference signal while reducing the range of the reference signal without increasing the amplification gain of the second equalizer filter 20. If the code having the larger input signal (that is, the reference signal control code) than the middle of the range of the reference signal is searched, then it may select the corresponding code signal (that is, the reference signal control code), and moves to the next step (that is, S200 step of observing the equalization filter characteristic). This method is relatively advantageous in terms of performance/implementation than the method of increasing the amplification gain. If the input signal is smaller than the middle range of the reference signal even if the range of the reference signal is reduced to the minimum, it is determined that there is no signal.

Figure 11:
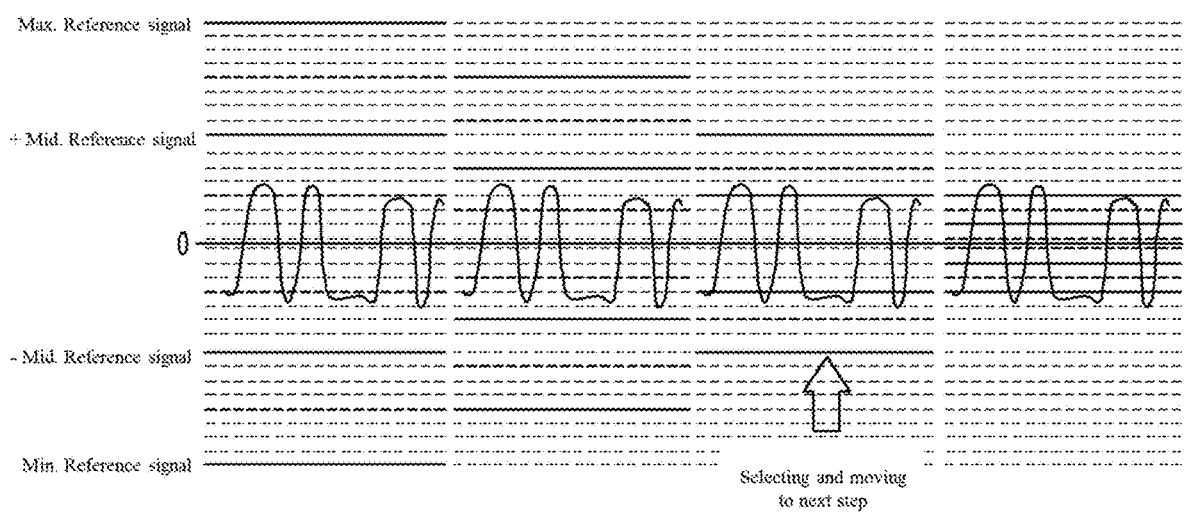

Unlike FIGS. 9 and 10, it is also possible that the range of the range of the reference signal is made dense without increasing the amplification gain of the second equalizer filter 20 as shown in FIG. 11.

As a result, in the input signal size determination step S100, the size of the input signal is compared while changing the range or the size of the input signal of the reference signal.

Hereinafter, the case of comparing the magnitude of the input signal by adjusting the amplification gain will be described again with reference to FIG. 12, and the case of comparing the magnitudes of the input signals by adjusting the range of the reference signal will be described again with reference to FIG. 13.

Figure 12:
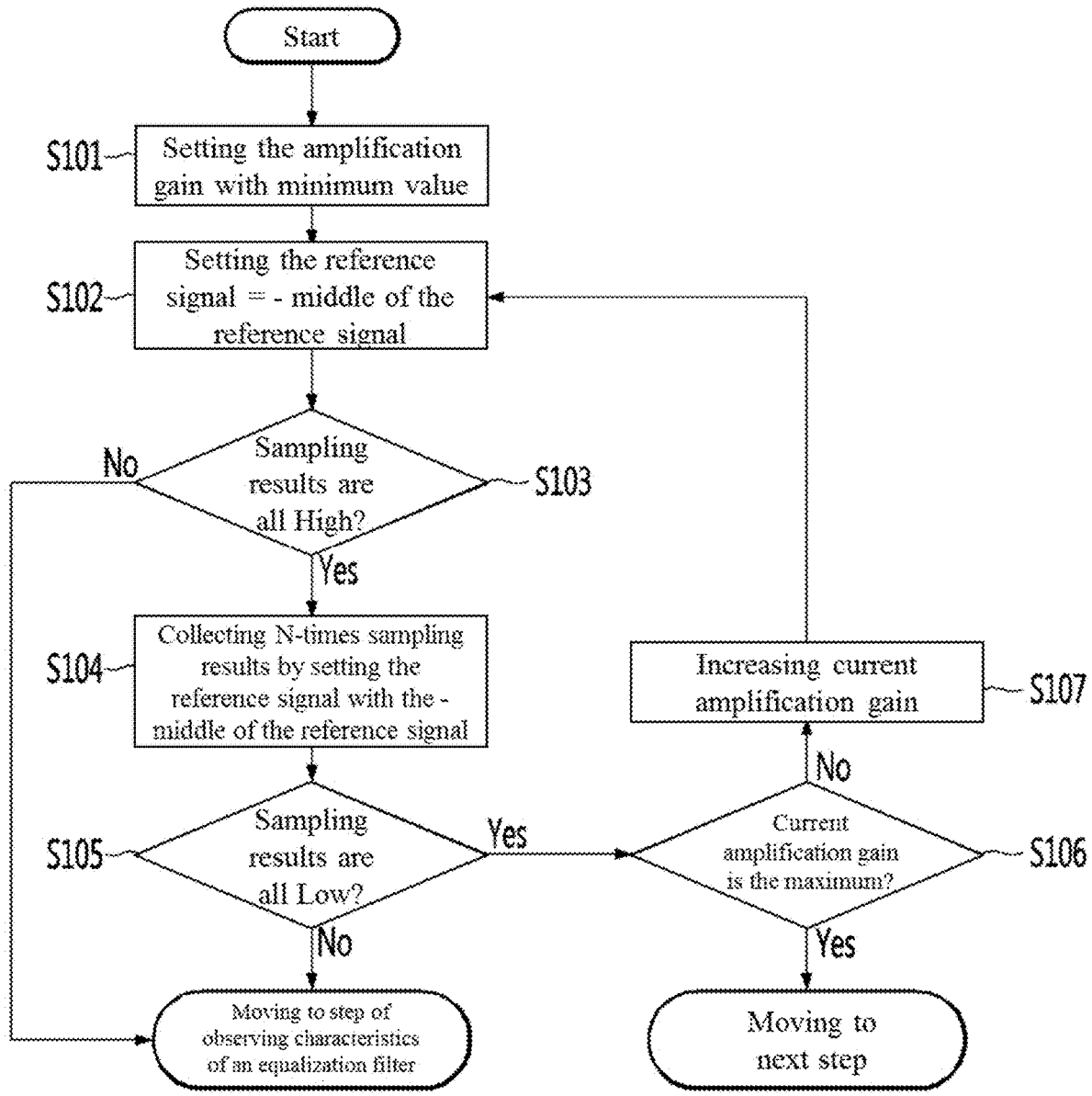

Referring to FIG. 12, the digital control unit 40 sets the amplification gain of the second equalizer filter 20 with a minimum value S101, and selects the N-times sampling results in the size comparison unit 30 S102 after setting the reference signal=- middle of the reference signal. If the sampling result in step S102 (i.e., the comparison value of the size comparison unit 30) is not High signal, the digital control unit 40 moves to the equalization filter characteristic observation step S200.

If all of the sampling results in step S102 (i.e., the comparison value of the size comparison unit 30) are all High signal ("Yes" in step S103), the digital control unit 40 collects the N-times sampling results in the size comparison unit 30 S104 after setting the reference signal with the - middle of the reference signal. If all of the sampling results in step S104 (i.e., comparison values of the size comparison unit 30) are all Low signal ("Yes" in step S105), the digital control unit 40 determines that the current amplification gain is the maximum value S106. If the current amplification gain is not the maximum, the digital control unit 40 increases the current amplification gain S107 and then returns to step S102 to repeat the operation from the corresponding step.

If the sampling result (that is, the comparison value of the size comparison unit 30) is not all Low signal in step S105, the digital control unit 40 moves to the equalization filter characteristic observation step S200, and if the amplification gain is the maximum in step S106, the process moves to the waiting step S300.

Thus, the amplitude of the input signal can be compared by searching the gain of the second equalizer filter 20 while increasing the amplification gain of the second equalizer filter 20.

Figure 13:
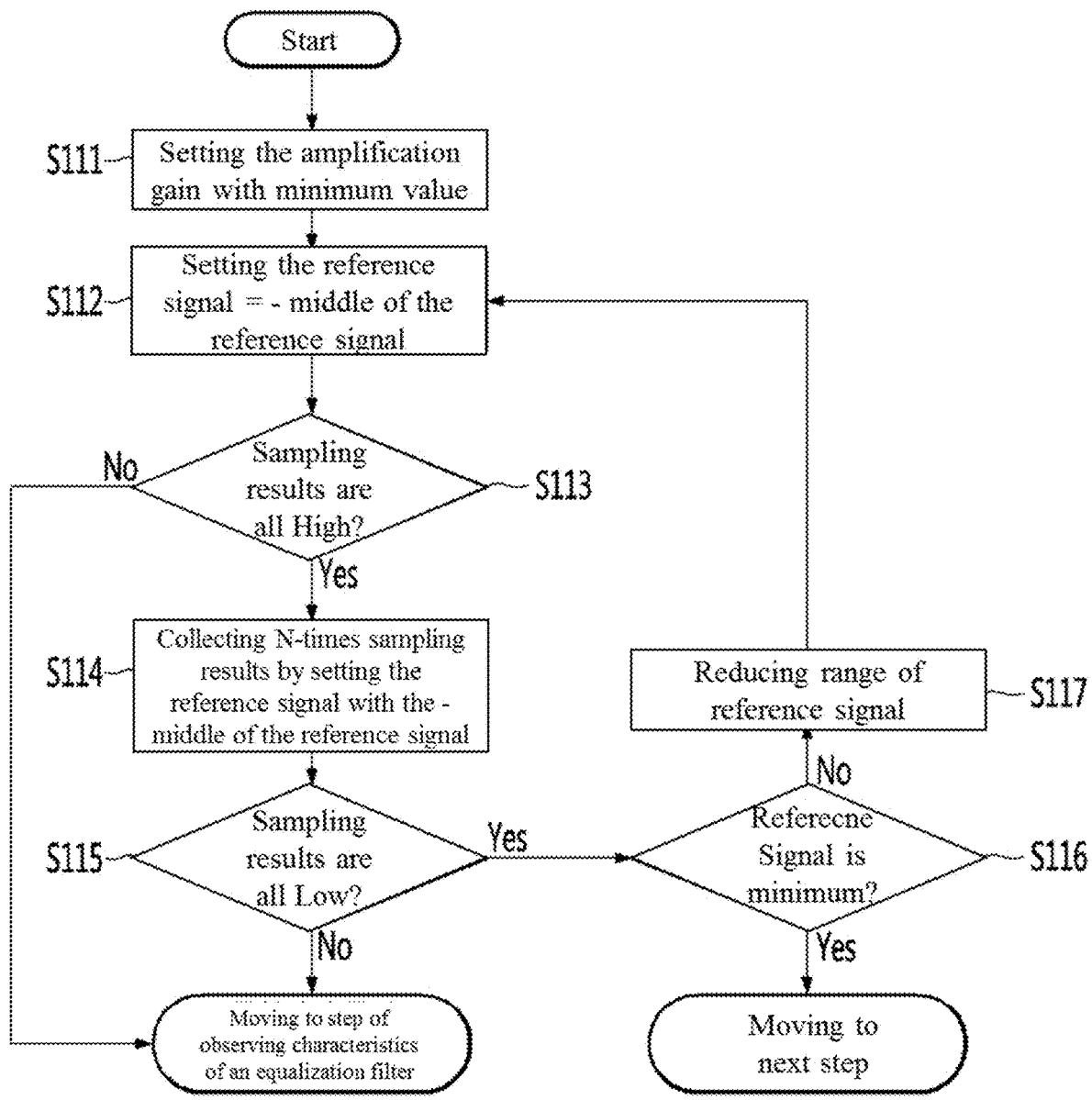

Referring to FIG. 13, the digital control unit 40 sets the range of the reference signal in the size comparison unit 30 to a maximum value S111, selects the result of sampling N times in the size comparison unit 30 after setting the reference signal with the − middle of the reference signal S112. If the sampling result at step S112 (that is, the comparison value of the size comparison unit 30) is not High signal, the digital control unit 40 moves to the equalization filter characteristic observation step S200.

If all of the sampling results in step S112 (i.e., the comparison value of the size comparison unit 30) are all High signal (Yes in step S113), the digital control unit 40 collects the result of N times sampling in the size comparison unit 30 S114 after setting the reference signal with the middle reference signal. If the sampling result in step S114 (i.e., the comparison value of the size comparison unit 30) is all Low signal ("Yes" in step S115), the digital control unit 40 determines whether the range of the current reference signal is the minimum value S116. If the range of the current reference signal is not the minimum, the digital control unit 40 reduces the range of the current reference signal S117, and the process returns to step S112 to repeat the operation of the corresponding step.

If the sampling result (that is, the comparison value of the size comparison unit 30) is not all Low signal in step S115, the digital control unit 40 moves to the equalization filter characteristic observation step S200, while if the range of the reference signal is the minimum value in step S116, the process moves to the waiting step S300.

The size of the input signal can be compared by adjusting the range of the reference signal of the size comparison unit 30 so that the input signal is larger than the range of the reference signal.

Figure 14:
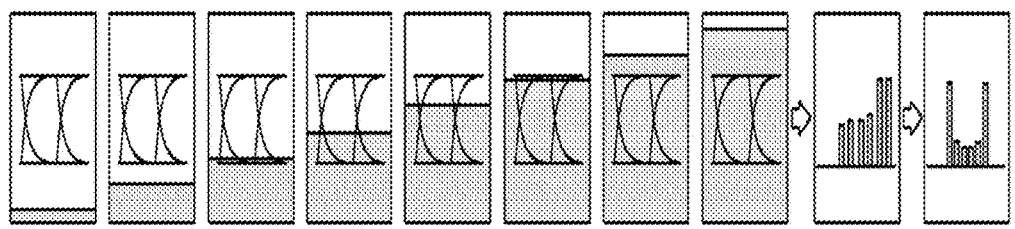
FIGS. 14 to 16 are views for explaining a characteristics observation step of an equalizer filter shown in FIG. 6.
Figure 15:
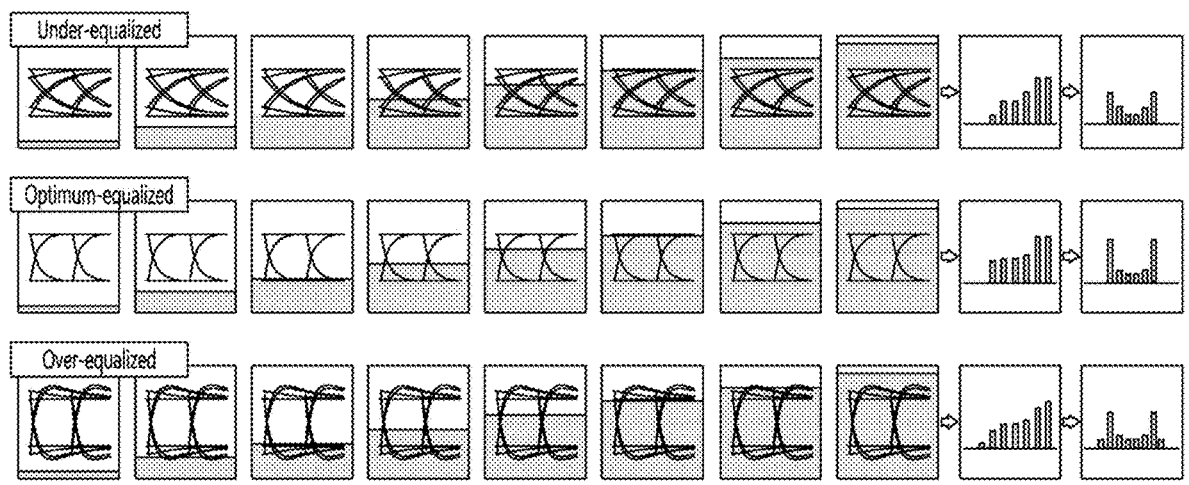
Figure 16:
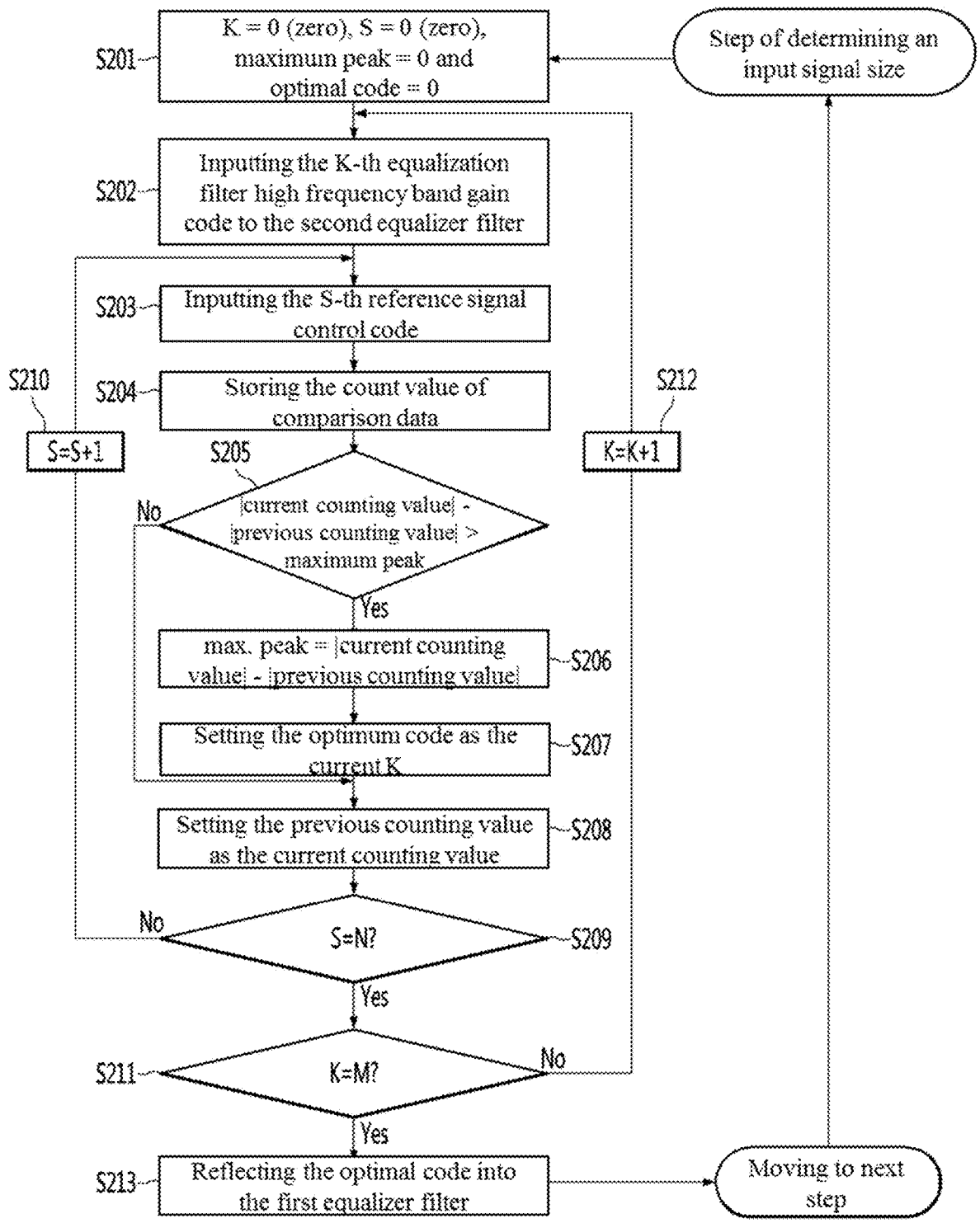

FIGS. 14 to 16 are views for explaining a characteristics observation step of an equalizer filter shown in FIG. 6. Since the first equalizer filter 10 and the second equalizer filter 20 have the same characteristics, it may be possible to observe the characteristics of the first equalizer filter 10 simply by observing the characteristics of the second equalizer filter 20.

Referring to FIG. 14, since the reference signal (i.e., reference voltage Vref) is lower than the range of the input signal, there are all Low signal, then the count value is 0 (zero). If the reference voltage falls within the input signal range, the count value is increased slightly by counting the comparison data. If the reference voltage is higher than the input signal range, there are all High signal, so the count value is the number of the sampling. The counted value is in the form of a cumulative density function CDF, and if the difference from the adjacent count value obtained the counted value can be expressed in the form of a probability density function PDF. The probability density function PDF indicates the probability that the input signal remains between each reference voltage and the reference voltage. Since the digital data of the size comparison unit 30 basically has a high or low value, there is High probability of staying at High or Low voltage. As a result, as shown in FIG. 14, the peak value is obtained in the probability density function PDF.

Here, the peak magnitude in the probability density function PDF varies depending on sufficient or insufficient state of the high/low frequency component as illustrated in FIG. 15. FIG. 15 shows how the adaptive equalizer finds the most optimal state depending on whether the data transition speed is slow, too fast or optimal. Here, the case where the data transition speed is slow is in the case of Under-equalized in FIG. 15, in the case where the transition speed of the data is too fast, it is the case of Over-equalized in FIG. 15, in the case where the transition speed of data is the case of optimal, it is Optimum-equalized in FIG. 15.

For example, if the high-frequency component is insufficient (i.e., Under-equalized), the data transition is slower than the optimal state (i.e., Optimum-equalized case), so that the probability of staying at the intermediate value is increased. This increases the probability density function PDF between High and Low and then the peak is reduced. Conversely, when the high frequency component is sufficient (i.e., over-equalized case), the data is more likely to jump out than the high/Low signal during the data transition than the optimum state (i.e., optimal-equalized), and the peak is reduced while increasing the probability density function PDF outside High and Low signal (Peak) increases.

As described above, the peak value where the peak on the probability density function PDF is maximized while changing the gain of the high-frequency band of the second equalization filter 20.

According to the step S200 of observing the equalization filter characteristics in the present invention, the amount of data to be stored can be greatly reduced. In the prior art (Korean Patent Registration No. 10-1074454), a probability density function PDF was stored for all equalizer control codes and the finally compared. But in the preferred embodiment of the present invention, the difference between the previous counting value is calculated after performing the sampling at every order, and if the previous counting value is stored if it is the maximum value, then the maximum value is stored but and the maximum value is discarded if it is not the maximum value.

In the prior art (Korean Patent Registration No. 10-1074454), the optimal value was found only once and the process was terminated. However, in the preferred embodiment of the present invention, it is changed to continuously circled. In the preferred embodiment of the present invention, a second equalizer filter 20 dedicated for monitoring is added, and continuous adaptive filter adaptation is possible.

Next, the step S200 of observing the equalization filter characteristics will be described in more detail with reference to FIG. 16.

First, the digital control unit 40 sets K=0 (zero), S=0 (zero), maximum peak=0 and optimal code=0 S201, inputs the K-th equalization filter high frequency band gain code to the second equalizer filter 20 S202. Where the K may be the equalization filter high frequency band gain code (i.e., an equalizer monitoring code applied to the second equalizer filter 20), and the S-th may be a reference signal control code.

Thereafter, the digital control unit 40 inputs the S-th reference signal control code to the size comparison unit 30 S203. Accordingly, the size comparison unit 30 will generate a reference signal (reference voltage) corresponding to the S-th reference signal control code (i.e., the 0-th reference signal control code).

Then, the digital control unit 40 collects the results of performing the X times sampling in the size comparison unit 30, counts the number of High signal of the collected sampling results, and temporarily stores the count value S204. For example, if the 0-th reference signal control code is applied to the size comparison unit 30, the size comparison unit 30 compares the input signal with the reference signal corresponding to the 0-th reference signal control code, and the counted value (the value obtained by counting the high number) of the data will be temporarily stored in the digital control unit 40.

Next, the digital control unit 40 determines whether the absolute value of the difference between the current counting value and the previous counting value is greater than the maximum peak S205.

If the absolute value of the difference between the current counting value and the previous counting value is greater than the maximum peak, the digital control unit 40 replaces the maximum peak with the absolute value of the difference between the current counting value and the previous counting value S206.

Then, the digital control unit 40 sets the optimum code as the current K S207, and sets the previous counting value as the current counting value S208.

Meanwhile, as a result of the determined step S205, if the absolute value of the difference between the current count value and the previous count value is not greater than the maximum peak, the digital control unit 40 moves to step S208. In other words, the difference from the previous one is calculated after the X times sampling is performed, and if it is the maximum, the temporarily stored count value is recorded, but if it is not the maximum, it is immediately discarded.

Thereafter, the digital control unit 40 determines whether S=N (S209). Here N means the maximum value of the reference signal control code. For example, N may be preset to "16".

If it is not "S=N", the digital control unit 40 returns to step S203 after setting "S=S+1" S210 and repeats the operation of the corresponding step. If the reference signal control code sequentially increases, the size comparison unit 30 will generate the reference signal (reference voltage) that sequentially increases.

Conversely, if "S=N", the digital control unit 40 determines whether K=M (S211). Here M means the maximum value of the equalization filter high-frequency band gain code. For example, M may be preset to "8".

If it is not "K=M", the digital control unit 40 returns to step S202 after setting "K=K+1" S212 and repeats the operation of the corresponding step.

Conversely, if "K=M", then the digital control unit 40 reflects the optimal code into the first equalizer filter (e.g., the first equalizer filter 10) with the most optimal equalizer control code for the current state of the first equalizer filter 10 S213. Accordingly, when the equalizer control code is applied to the first equalizer filter 10, the adaptive equalization apparatus according to the preferred embodiment of the present invention can be controlled to obtain the optimum equalization gain.

As described above, an optimal embodiment has been disclosed in the drawings and specification. While specific terms have been employed herein, they are used for the purpose of describing the invention only and are not used to limit the scope of the invention as defined in the claims or the claims. Therefore, those skilled in the art will appreciate that various modifications and equivalent embodiments are possible without departing from the scope of the present invention. Accordingly, the true scope of the present invention should be determined by the technical idea of the appended claims.

What is claimed is:

1. An adaptive equalization apparatus comprising:
   a first equalizer filter compensating and outputting for components of a high frequency band of an input signal;
   a second equalizer filter, installed in parallel with the first equalizer filter, monitoring the input signal;
   a size comparison processor sampling the size of a monitoring signal from the second equalizer filter at each period of an asynchronous clock signal; and
   a digital control processor collecting a comparison data in the size comparison processor as changing an equalizer monitoring code to be provided to the second equalizer filter and a reference signal of the size comparison processor, and finding and providing an optimal equalizer control code to the first equalizer filter based on the collected comparison data;
   wherein the second equalizer filter compensates and outputs a signal according to an equalizer monitoring code of the digital control processor to find the optimal equalizer control code in the digital control processor.

2. The adaptive equalization apparatus according to claim 1, wherein the size comparison processor comprising:
   a reference signal generation processor generating a reference signal of an analog component corresponding to a reference signal control code from the digital control processor;
   an analog comparison processor obtaining a difference between the monitoring signal from the second equalizer filter and the reference signal from the reference signal generation processor and outputting the difference as an analog signal; and
   a sampling circuit processor sampling and digitizing the output signal outputted from the analog comparison processor for each period of the asynchronous clock signal.

3. The adaptive equalization apparatus according to claim 2, wherein the reference signal control code is a code for determining the level of the reference signal and is any one selected among N codes having different levels, wherein N denotes a non-zero positive integer.

4. The adaptive equalization apparatus according to claim 1, wherein the digital control processor adjusts the size of the input signal so that the input signal received by the size comparison processor has a range of a specific reference signal,
   calculates the peak value of a histogram by changing the equalizer monitoring code of the second equalizer filter or the reference signal of the size comparison processor after the adjustment is completed; and
   applies an optimal equalizer control code found on the basis of the calculated peak value to the first equalizer filter.

5. An adaptive equalization method in an adaptive equalization apparatus including a first equalizer filter compensating and outputting for components of a high frequency band of a input signal; a second equalizer filter, installed in parallel with the first equalizer filter, monitoring the input signal; a size comparison processor sampling the size of a monitoring signal from the second equalizer filter at each period of an asynchronous clock signal; and a digital control processor collecting comparison data in the size comparison processor as changing an equalizer monitoring code and a reference signal of the size comparison processor which will be provided to the second equalizer filter, and finding and providing an optimal equalizer control code to the first equalizer filter based on the collected comparison data, the method comprising:

adjusting the size of the input signal so that the input signal received by the size comparison processor has a range of a specific reference signal; and calculating the peak value of a histogram by changing the equalizer monitoring code of the second equalizer filter or a reference signal of the size comparison processor, and applying the optimal equalizer control code found on the basis of the calculated peak value to the first equalizer filter.

6. The adaptive equalization method according to claim 5, further comprises moving a standby mode when the input signal for the adaptive equalization apparatus is too small, and moving the standby mode when the applying step is completed.

7. The adaptive equalization method according to claim 6, wherein the adjusting step comprising:

setting an amplification gain of the second equalizer filter to a minimum value;

collecting N-times first sampling results in the size comparison processor after setting the reference signal to a middle reference signal;

collecting N-times second sampling results in the size comparison processor after setting the reference signal to a + middle reference signal if the first sampling results are all High signal;

determining whether the current amplification gain is the maximum if the N-times second sampling results in the size comparison processor are all Low signal after setting the reference signal to the + middle reference signal; and returning to the step of collecting N-times first sampling results in the size comparison processor, after increasing the current amplification gain if the current amplification gain is not the maximum, wherein N denotes a non-zero positive integer number.

8. The adaptive equalization method according to claim 7, wherein if the N-times first sampling results in the size comparison processor are not all High signal after setting the reference signal to the −middle reference signal, or if all of the N-times second sampling results in the size comparison processor are not Low signal after setting the reference signal to the + middle reference signal, then a present process moves to the applying step to performs the operation of the corresponding step.

9. The adaptive equalization method according to claim 7, wherein if the current amplification gain is the maximum, the present process enters the standby mode.

10. The adaptive equalization method according to claim 6, wherein the adjusting step comprising:

setting a range of the reference signal in the size comparison processor to a maximum level;

collecting N-times first sampling results in the size comparison processor after setting the reference signal to a −middle reference signal;

collecting N-times second sampling results in the size comparison processor after setting the reference signal to a + middle reference signal if the first sampling results are all High signal;

determining whether a range of the current reference signal is a minimum value if all the N-times second sampling results in the size comparison processor are Low signal after setting the reference signal to the + middle reference signal; and returning to the step of collecting the N-times first sampling results in the size comparison processor, after reducing the range of the current reference signal if the range of the current reference signal is not the minimum.

11. The adaptive equalization method according to claim 10, wherein if the N-times first sampling results in the size comparison processor are not all High signal after setting the reference signal to the −middle reference signal, or if all of the N-times second sampling results in the size comparison processor are not Low signal after setting the reference signal to the + middle reference signal, then the current process moves to the applying step to perform the operation of the corresponding step.

12. The adaptive equalization method according to claim 10, if the range of the current reference signal is the minimum value, the present process enters to the standby mode.

13. The adaptive equalization method according to claim 5, wherein the applying step comprising:

setting an equalizer monitoring code K as 0, a reference signal control code S as 0, a maximum peak as 0, and an optimal code as 0;

inputting a K-th equalizer monitoring code to the second equalizer filter;

generating a reference signal corresponding to an S-th reference signal control code, collecting X-times sampling results in the size comparison processor, and counting High signal of sampling results, wherein each of K, S, and X denotes integer;

determining whether an absolute value of a difference between the counted current count value and a previous counted value is greater than the maximum peak;

replacing the maximum peak with the absolute value of the difference between the current counting value and the previous counting value, if the absolute value of the difference between the current counting value and the previous counting value is greater than the maximum peak, replacing the maximum peak with a value of the present monitoring code, and replacing the previous counting value with the current counting value;

determining whether a value of the reference signal control code is a maximum value of a predetermined reference signal control code;

determining whether the value of the equalizer monitoring code is the maximum value of a predetermined equalizer monitoring code if the value of the reference signal control code is the maximum value of the reference signal control code; and wherein if the value of the equalizer monitoring code is the maximum value of the predetermined equalizer monitoring code, an optimum code is used as an optimal equalizer control code and is reflected on the first equalizer filter.

14. The adaptive equalization method according to claim 13, wherein if the absolute value of the difference between the current counting value and the previous counting value is not greater than the maximum peak, and the previous counting value is replaced with the current counting value without replacement of the maximum peak and the optimum code.

15. The adaptive equalization method according to claim 13, as a result of the determination in the step of determining whether the value of the reference signal control code is the maximum value of the predetermined reference signal control code, if the value of the reference signal control code is not the maximum value of the reference signal control code, the method further comprising generating the reference signal corresponding to the S-th reference signal control code is generated by adding +1 to the value of the reference signal control code, collecting the X-times sampling result in the size comparison processor and moving to the step of counting the High signal of sampling results to be collected.

16. The adaptive equalization method according to claim 13, wherein as a result of the determination in the step of determining whether the value of the equalizer monitoring code is the maximum value of the equalizer monitoring code, if the value of the equalizer monitoring code is not the maximum value of a predetermined equalizer monitoring code, the present process moves the step of inputting the K-th equalizer monitoring code to the second equalizer filter by adding +1 to the value of the equalizer monitoring code.

17. The adaptive equalization method according to claim 6, wherein in the standby mode the power of the first equalizer filter is turned off, if it is determined that there is no signal in the adjusting step.

18. The adaptive equalization method according to claim 6, wherein in the standby mode, the power of the second equalizer filter and the size comparison processor is turned off, after the applying step.

* * * * *